(12) United States Patent
Saho

(10) Patent No.: US 6,857,546 B2
(45) Date of Patent: Feb. 22, 2005

(54) TAPE FEEDER

(75) Inventor: Hidehiro Saho, Saga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/462,474

(22) Filed: Jun. 16, 2003

(65) Prior Publication Data
US 2003/0230617 A1 Dec. 18, 2003

(30) Foreign Application Priority Data
Jun. 18, 2002 (JP) .................................... P. 2002-176854

(51) Int. Cl.[7] .......................... B65G 20/00; G03B 1/24
(52) U.S. Cl. ..................... 226/188; 226/110; 242/564.4
(58) Field of Search ................................. 226/110, 128, 226/188, 80; 242/564.4, 564.3

(56) References Cited

U.S. PATENT DOCUMENTS 5,024,720 A 6/1991 Boss et al.
5,299,902 A * 4/1994 Fujiwara et al. ....... 414/416.01
2003/0127487 A1 * 7/2003 Liebeke ....................... 226/188

FOREIGN PATENT DOCUMENTS

| DE | 39 03 865 C1 | 7/1990 |
| EP | 2000-114777 | 4/2000 |
| JP | 2000-114778 | 4/2000 |
| JP | 2000-114779 | 4/2000 |
| JP | 2000-277980 | 10/2000 |
| WO | WO 01/82660 A2 | 11/2001 |

* cited by examiner

Primary Examiner—Eileen D. Lillis
Assistant Examiner—Evan Langdon
(74) Attorney, Agent, or Firm—Pearne & Gordon LLP

(57) ABSTRACT

In a double type tape feeder in which two tape feed mechanisms that pitch-feed carrier tapes holding electronic components are arranged in parallel and two carrier tapes can be simultaneously supplied, sprockets in the tape pitch feed mechanisms are arranged so that they hold a shaft axis in common, and directions of respective rotary shafts of motors are coincided with each other toward the shaft axis, so that the motors are arranged in radial pattern. Hereby, an overlap of widthwise sizes of the motors in plane arrangement is permitted. Therefore, the whole width size is reduced and a compact tape feeder is realized.

3 Claims, 7 Drawing Sheets

TAPE FEEDER

BACKGROUND OF THE INVENTION

The present invention relates to a tape feeder which pitch-feeds electronic parts held on a carrier tape to supply them to a pick-up position of an electronic part mounting apparatus.

As a method of supplying electronic parts in an electronic part mounting apparatus, a method using a tape feeder has been known. In this method, a carrier tape holding electronic parts is pulled out from a supply reel, and it is pitch-fed in synchronization with mount timing of electronic parts, whereby the electronic parts are supplied to a pick-up position for a mount head.

Such the tape feeder includes a tape feed mechanism, and recently a motor drive type tape feeder in which each tape feeder itself has a motor as a tape feed drive source is used. By adoption of the motor drive type, it is possible to control freely a feed pitch and a stop position in tape feed by motor control, so that there is advantage that a tape feeder having good wide-use can be realized.

In order to downsize the electronic part mounting apparatus, a multi-type tape feeder is used, which supplies plural tapes by the same tape feeder for the purpose of making arrangement pitch of tape feeders small. However, in case that the above motor drive type is applied to this multi-type tape feeder, since the plural motors are arranged in parallel, a size in the width direction of the tape feeder becomes large, so that it is difficult to realize a compact tape feeder.

SUMMARY OF THE INVENTION

Therefore, an object of the invention is to provide a multi-type tape feeder of which a widthwise size is compact.

According to the first aspect of the invention, a tape feeder pitch-feeds a carrier tape holding electronic parts thereby to supply them to a pick-up position for a mount head of an electronic part mounting apparatus, wherein plural tape feed mechanisms each having a tape feed member that rotates around a horizontal axis thereby to perform a tape feed operation, and an electric motor that rotation-drives a first bevel gear rotating this tape feed member and a second bevel gear engaging with the first bevel gear are arranged in parallel, in arrangement of the plural tape feed mechanisms, the respective first bevel gears are arranged in positions where they hold a shaft axis in common, and the electric motors are arranged in radial pattern so that their rotary shaft directions coincide with each other toward the shaft axis.

Furthermore the tape feed mechanism is a tape pitch feed mechanism which pitch-feeds the carrier tape, and the tape feed member is a sprocket which interlocks with feed holes formed in the carrier tape at a fixed pitch.

Furthermore the tape feed mechanism is a top tape feed mechanism which feeds a top tape separated from the carrier tape before the pick-up position in the opposite direction to the tape feed direction, and the tape feed member is a rotary feed member which feeds the top tape with it nipped between.

According to the invention, regarding arrangement of the tape feed mechanisms of the multi-type tape feeder in which the plural tape feed units are arranged in parallel, the respective first bevel gears are arranged in the positions where they hold a shaft axis in common, and the electric motors are so arranged in radial pattern that their rotary shaft directions coincide with each other toward this shaft axis, whereby widthwise sizes of the electric motors can be overlapped, so that the whole width size of the multi-type tape feeder can be reduced.

DESCRIPTION OF THE PREFERRED EMBODIMENT

Figure 1:
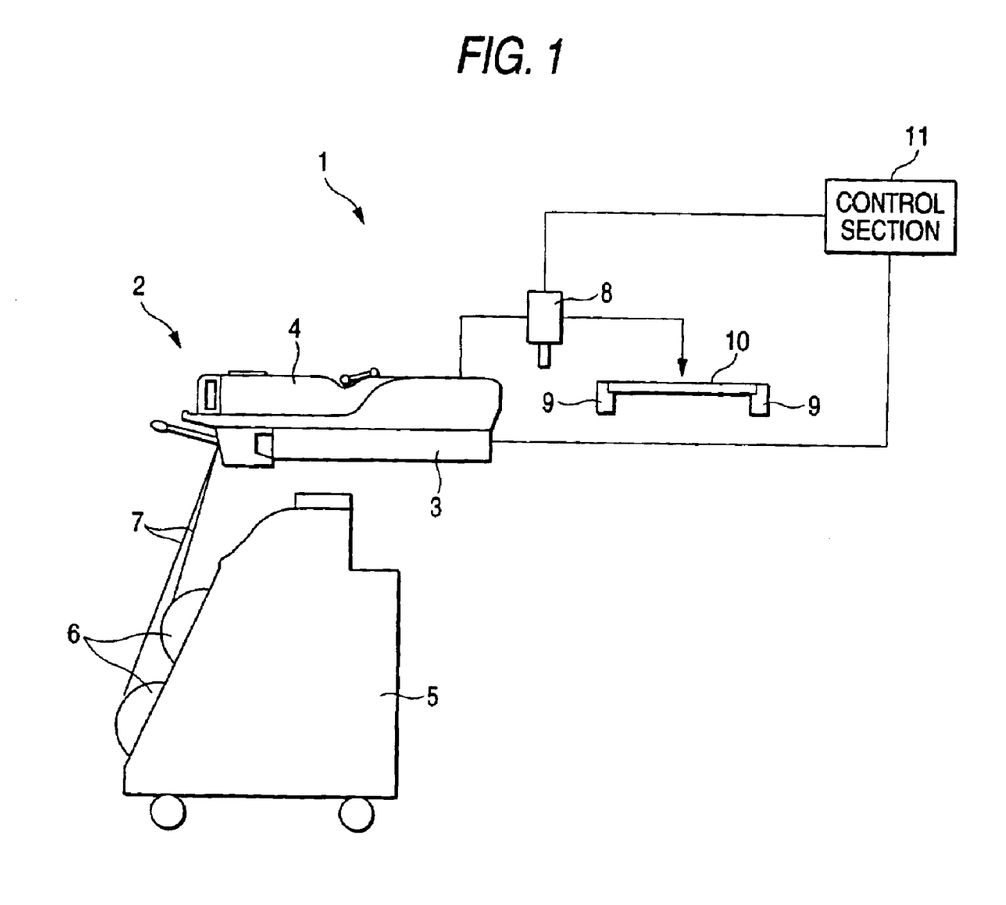
FIG. 1 is a sectional view of an electronic part mounting apparatus to which a tape feeder according to one embodiment of the invention is attached.
Figure 4:
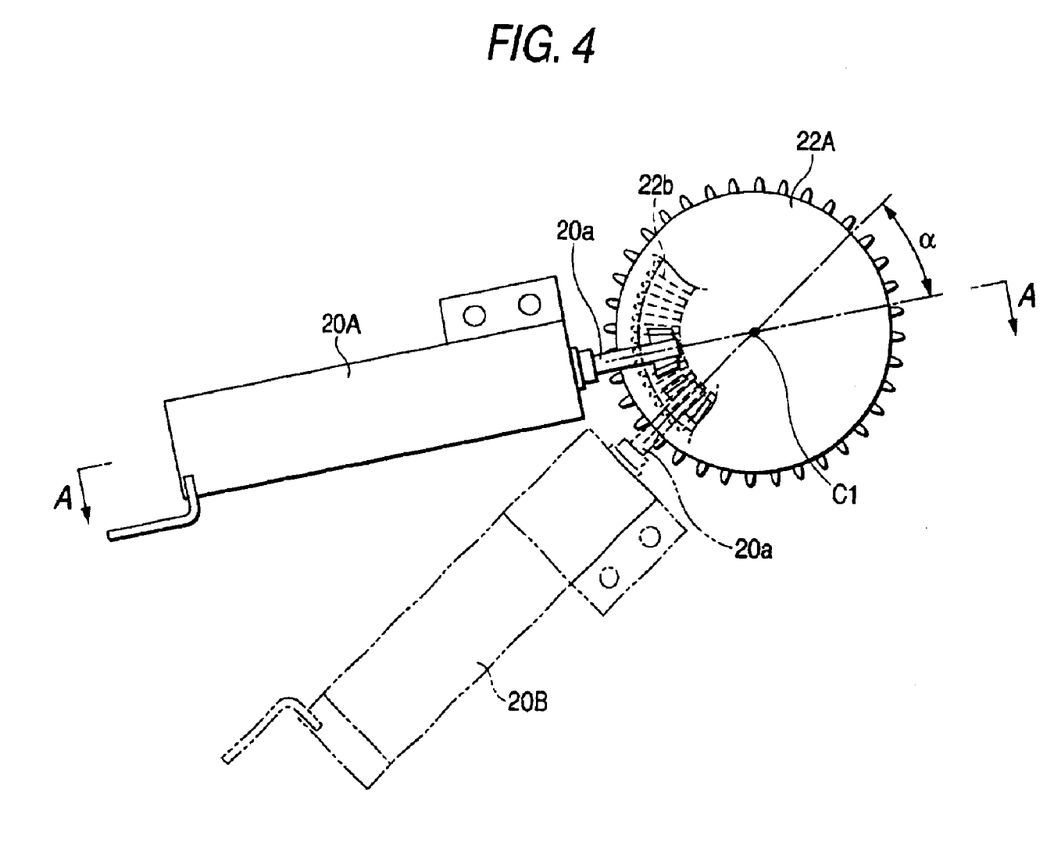
FIG. 4 is an explanatory view of motor arrangement of a tape feed mechanism in the tape feeder according to the embodiment of the invention.
Figure 5:
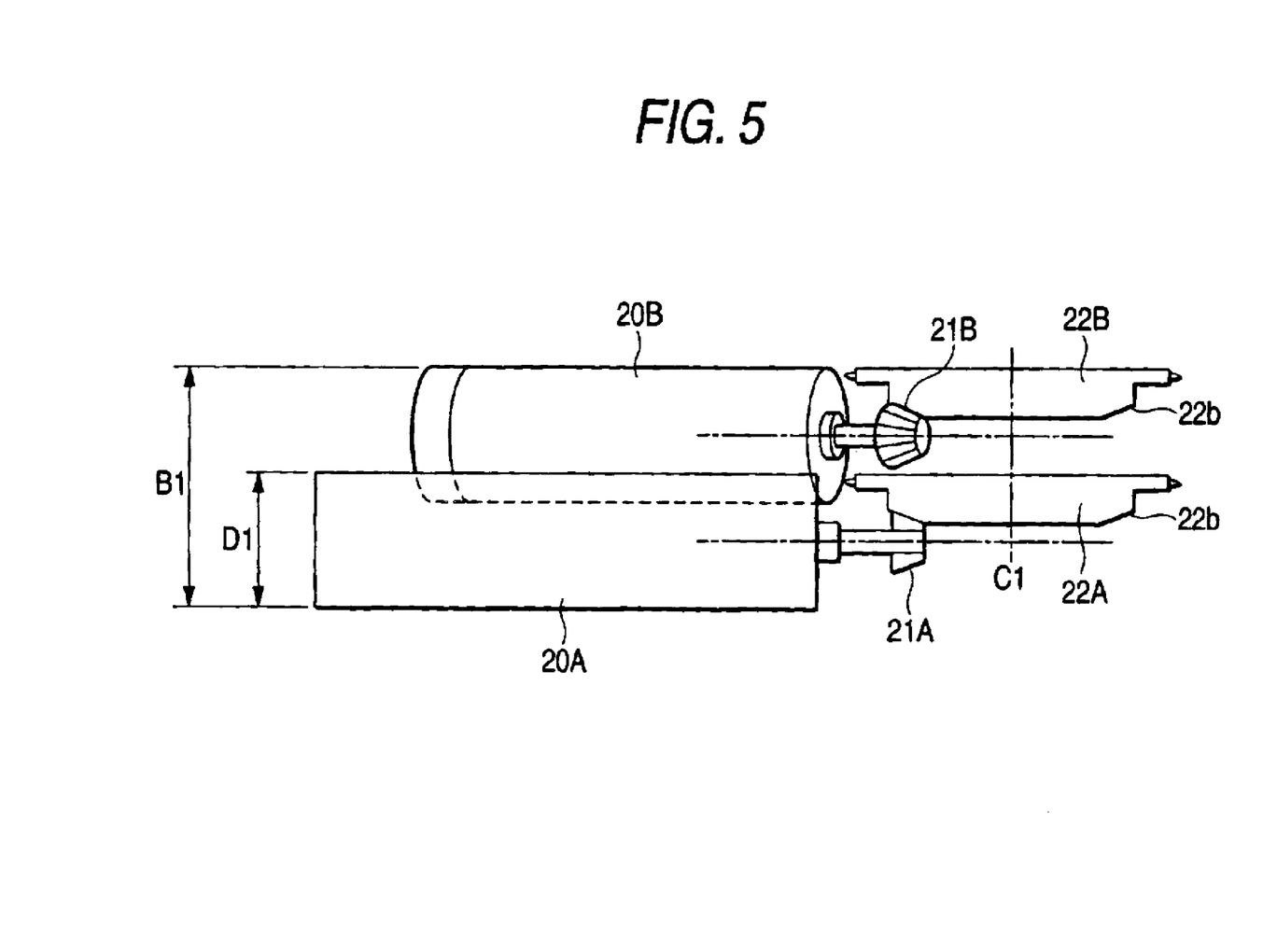
FIG. 5 is an explanatory view of motor arrangement of the tape feed mechanism in the tape feeder according to the embodiment of the invention.
Figure 6:
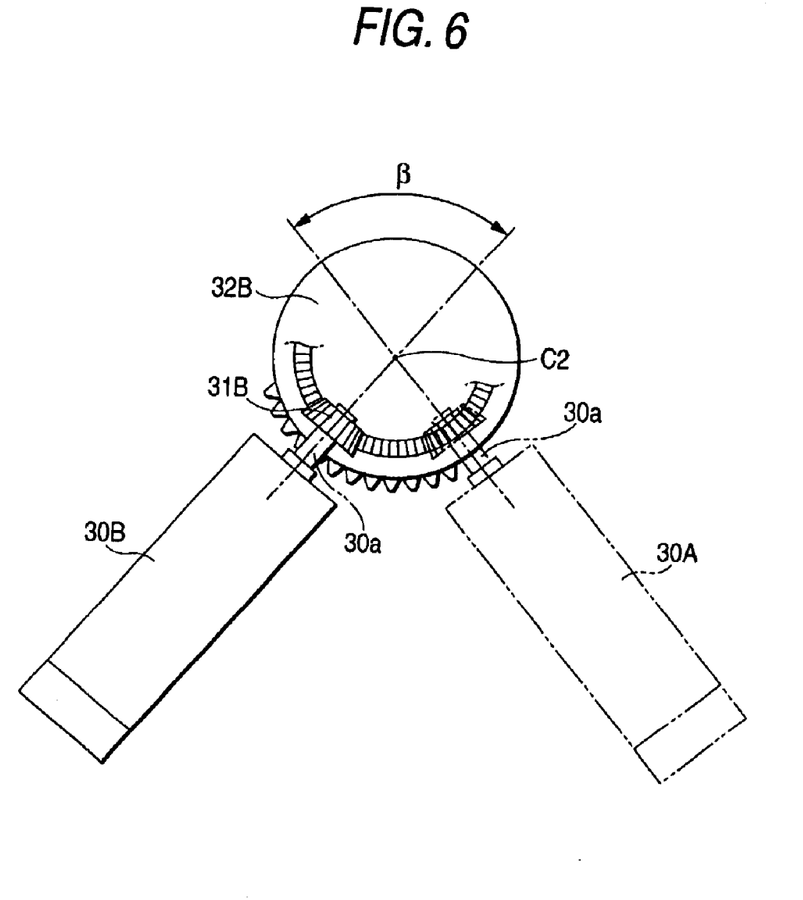
FIG. 6 is an explanatory view of motor arrangement of a top tape feed mechanism in the tape feeder according to the embodiment of the invention.
Figure 7:
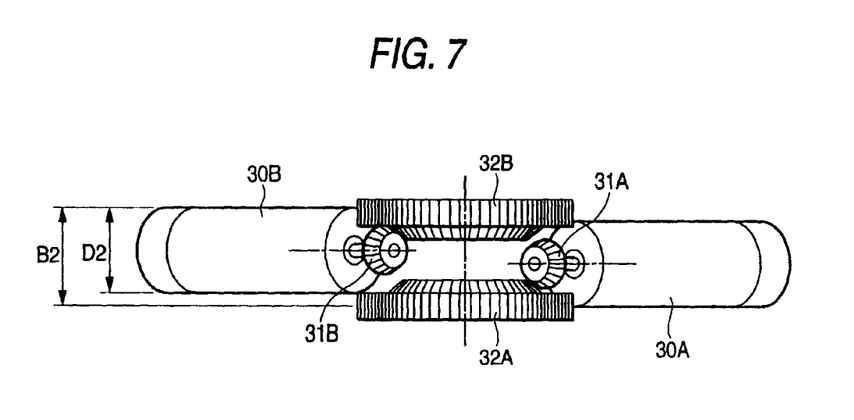
FIG. 7 is an explanatory view of motor arrangement of the top tape feed mechanism in the tape feeder according to the embodiment of the invention.

An embodiment of the invention will be described with reference to drawings. FIG. 1 is a sectional view of an electronic part mounting apparatus to which a tape feeder according to one embodiment of the invention is attached, FIG. 2 is a perspective view of the tape feeder according to the embodiment of the invention, FIG. 3 is an explanatory view of the mechanism of the tape feeder according to the embodiment of the invention, FIGS. 4 and 5 are explanatory views of motor arrangement of a tape feed mechanism in the tape feeder according to the embodiment of the invention, and FIGS. 6 and 7 are explanatory views of motor arrangement of a top tape feed mechanism in the tape feeder according to the embodiment of the invention.

Referring first to FIG. 1, the structure of an electronic part mounting apparatus will be described. In FIG. 1, an electronic part mounting apparatus 1 includes a component supply section 2 which supplies electronic parts, and a plurality of tape feeders 4 are attached on a top surface of a feeder base 3 provided for the component supply section 2. The tape feeders 4 pull out carrier tapes 7 holding electronic parts from plural supply reels 6 set in a truck 5 located below the feeder base 3, and supply the held electronic parts to a pick-up position for a mount head 8. The mount head 8 is controlled by a control section 11, and mounts the electronic part picked up from the tape feeder 4 on a base plate 10 positioned on a transporting path 9.

Figure 2:
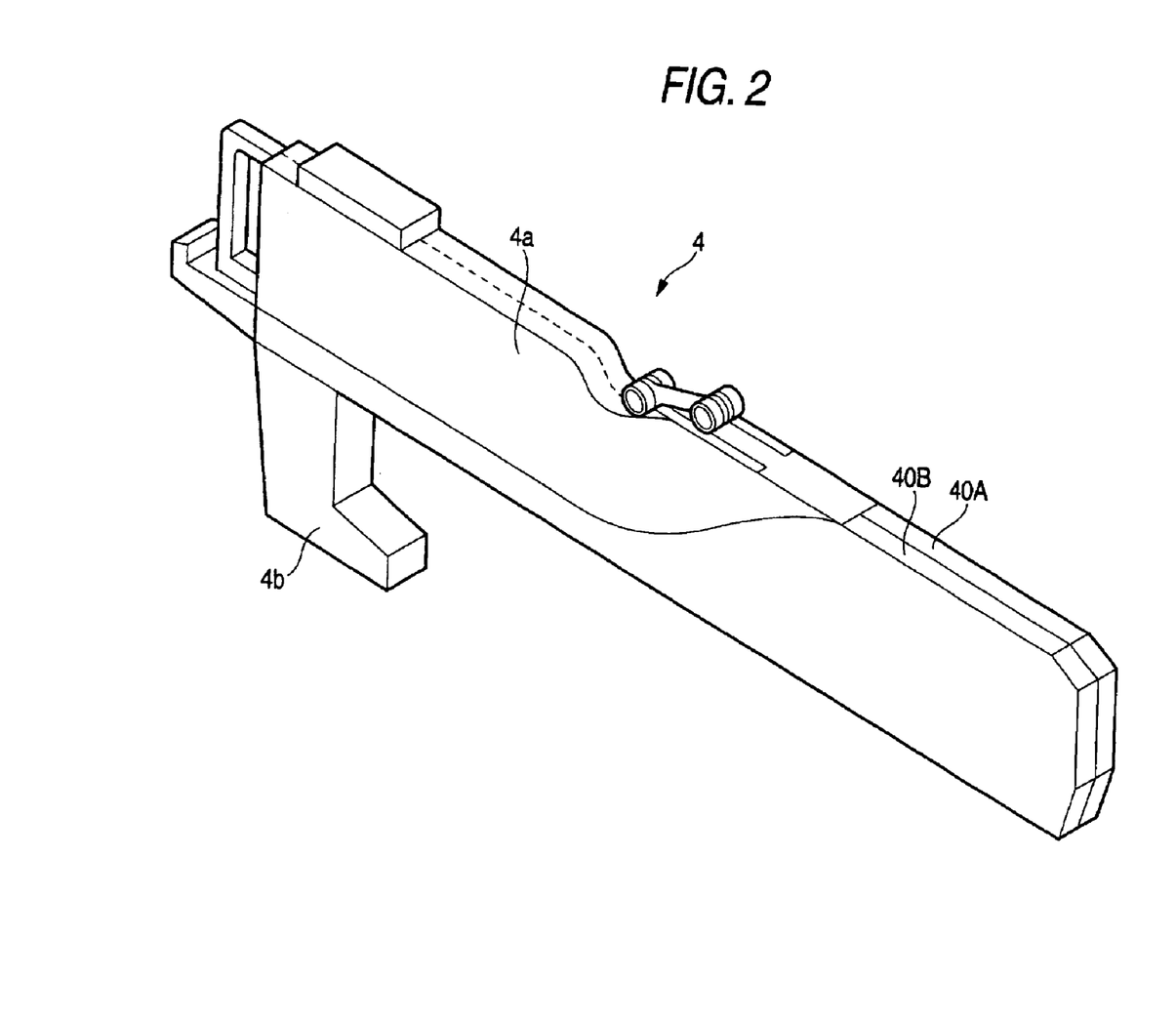
FIG. 2 is a perspective view of the tape feeder according to the embodiment of the invention.
Figure 3:
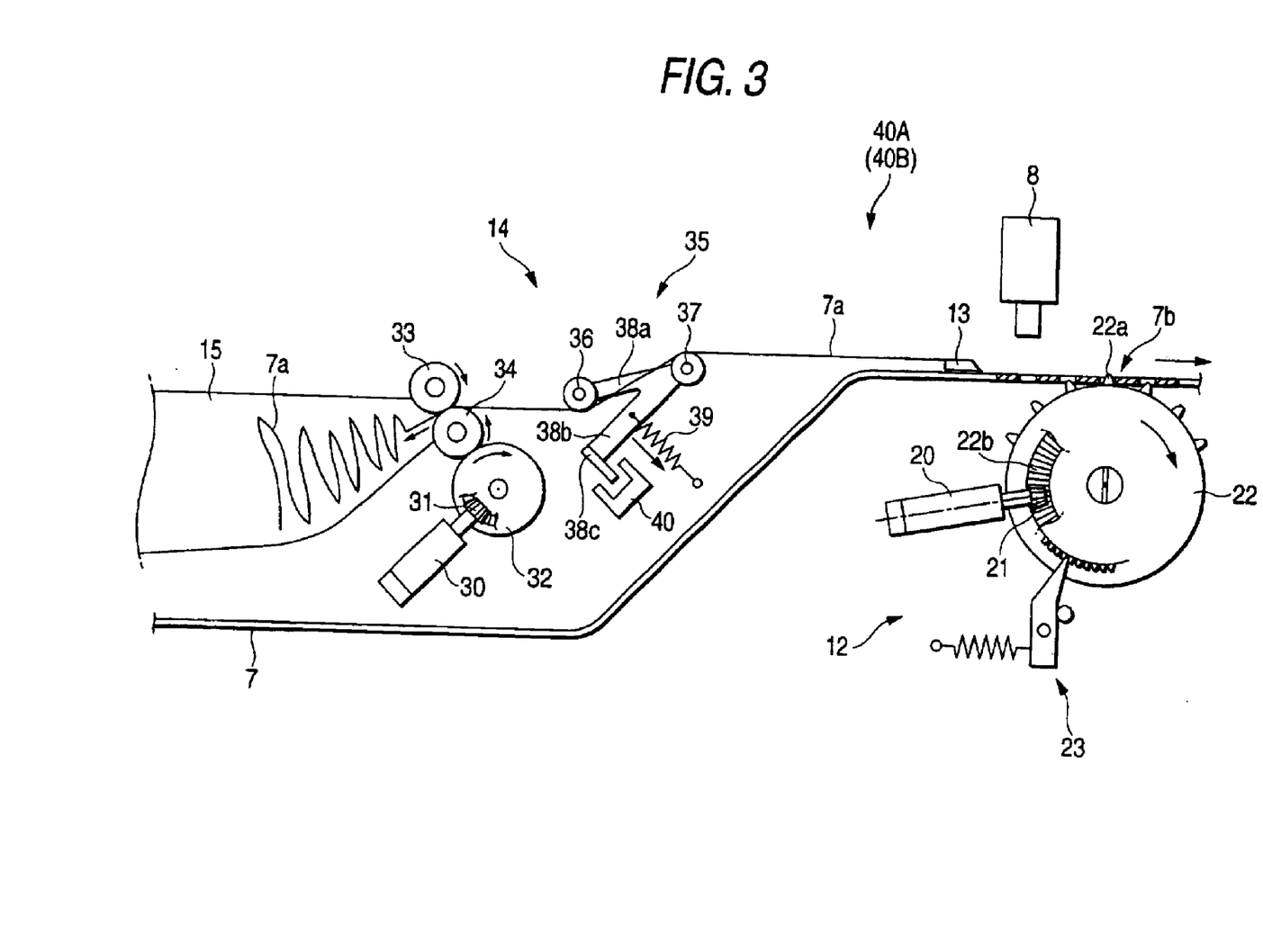
FIG. 3 is an explanatory view of the mechanism of the tape feeder according to the embodiment of the invention.

Referring next to FIGS. 2 and 3, the tape feeder 4 will be described. In FIG. 2, the tape feeder 4 is attached so that a lower surface of its elongate main body 4a that is a frame member is located along an upper surface of the feeder base 3, and a fitting portion 4b provided on the lower surface of the main body 4a is fitted to an end portion of the feeder base 3, whereby the position of the tape feeder 4 is fixed. The tape feeder 4 is a double type tape feeder, in which two feeder units 40A and 40B included in the common main body 4a can supply two carrier tapes 7 simultaneously and independently in parallel.

Referring next to FIG. 3, a tape pitch feed mechanism 12 and a top tape feed mechanism 14 provided for the feed units 40A and 40B will be described. In FIG. 3, to a sprocket 22 a bevel gear 22b is integrally coupled, and the sprocket is rotatably supported by a horizontal rotary shaft. A bevel gear 21 rotation-driven by a motor 20 engages with the bevel gear 22b. By driving the motor 20, the sprocket 22 rotates about the horizontal shaft.

Pins 22a are provided at the periphery of the sprocket 22 at a fixed pitch. The sprocket 22 rotates in a state where the pin 22a fits into a feed hole 7b formed in the carrier tape 7 thereby to perform tape feed. In this tape feed operation, the sprocket 22 performs an intermittent rotary operation corresponding to a pitch feed pattern, and a rotation stop position in the intermittent rotation is determined mechanically by a positioning mechanism 23.

In the above constitution, the sprocket 22 interlocks with the feed holes 7b formed in the carrier tape 7 at a fixed pitch and rotates about the horizontal shaft thereby to pitch-feed the carrier tape 7. Therefore, the sprocket 22 functions as a tape feed member which performs a tape feed operation, and the bevel gears 22b and 21 correspond respectively to a first bevel gear which rotates this tape feed member, and a second bevel gear engaging with this first bevel gear. Further, the motor 20 functions as an electric motor which rotation-drives the bevel gear 21.

Before the pick-up position for the mount head 8, a separation member 13 is arranged, separates a top tape 7a from a top surface of the carrier tape 7 fed forward (in the right direction in the figure), and turns up and feeds the top tape 7 in the opposite direction to the tape feed direction. The fed top tape 7a is fed into a tape-housing container 15 by a top tape feed mechanism 14.

The top tape feed mechanism 14 includes two rotary feed members 34 and 35 which rotate about horizontal shafts and come into contact with each other at their peripheries. The rotary feed members 33 and 34 are rotation-driven by a bevel gear 32, and the bevel gear 32 is rotation-driven by a motor 30 through a bevel gear 31.

Each of the rotary feed member 33, 34 is so constituted that flat teeth are formed at the periphery of a roller-like rotator. The bevel gear 32 rotates in a state where the top tape 7a is nipped between the flat teeth of the rotary feed members 33, 34, whereby the top tape 7a is surely fed into the tape housing container 15 without causing slip.

Under the above constitution, the rotary feed members 33 and 34 which feed the top tape 7a with it nipped between rotate about the horizontal shafts thereby to feed the carrier tape 7a to the opposite side to the tape feed direction. Therefore, the rotary feed members 33, 34 function as a tape feed member which performs a tape feed operation, and the bevel gears 32, 31 correspond respectively to a first bevel gear which rotates this tape feed member, and a second bevel gear engaging with this first bevel gear. Further, the motor 30 functions as an electric motor which rotation-drives the bevel gear 31.

Before the rotary feed members 33 and 34, a tension mechanism 35 including a movable tension roller 36 is arranged. The tension roller 36 is held by a lever member 38a having a coaxial fulcrum with a guide roller 37. The separated top tape 7a goes to the upside of the guide roller 37 and the downside of the tension roller 36, and is led backward. To an arm 38b formed integrally with the lever member 38a, a spring 39 is coupled, and the lever member 38a and the arm 38b are always energized downward by the spring 39. Hereby, tension is applied to the top tape 7a by the tension roller 36.

When looseness is produced in the top tape 7a at the position of the tension mechanism 35, the tension roller 36 moves downward. Correspondingly, the arm 38b rotates by the energizing force of the spring 39, and a dog 38c provided at a leading end of the arm 38b moves downward. This displacement is detected by a photo switch 40, whereby the looseness of the top tape 7a is detected. In case that the looseness has been detected, the motor 30 is immediately rotation-driven, whereby the loosened top tape 7a is fed into the tape housing container 15, so that the predetermined tape tension is kept.

Referring next to FIGS. 4 and 5, arrangement of the motor 20 in the tape pitch feed mechanism 12 will be described. Regarding the constitution of the tape feeder 4, the two feeder units 40A and 40B constituting the double feeder are arranged closely and in parallel in order to make the widthwise size as small as possible. Two sets of tape pitch feed mechanisms 12 and two sets of top tape feed mechanisms 14 are arranged respectively in parallel.

FIG. 4 shows side arrangement of the sprockets 22 and the motors 20 in the feeder units 40A and 40B, in which reference numerals 20A, 20B, 21A, 21B, 22A, and 22B show respectively positions of the motors 20, the bevel gears 21, and the sprockets 22 in the feeder units 40A and 40B. Further, FIG. 5 shows a cross section taken along a line A—A in FIG. 4.

As shown in FIGS. 4 and 5, the respective sprockets 22A, 22B and the bevel gears 22b formed integrally with the sprockets are arranged coaxially in the two feeder units 40A and 402, and they hold a shaft axis C1 in common. Further, directions of the respective rotary shafts 20a of the motors 20A and 20B are coincided with each other toward this shaft axis C1, so that the motors 20A and 202 are arranged in radial pattern. In this radial arrangement, directions of the respective rotary shafts 20a of the motors 20A and 202 are distributed around the shaft axis C1 at such an angle α that the motors 20A and 202 are not superimposed on each other in side arrangement.

By adopting this motor arrangement, as shown in FIG. 5, the width sizes of the two motors 20A and 20B can be overlapped in plane arrangement, so that the whole width B1 including the motors 20A and 20B can be made smaller than a twice size of diameter D1 of a single motor. Namely, under the constitution in which the two motors 20A and 202 for rotation-driving respectively the coaxial sprockets 22A and 222 are arranged closely, since the widthwise size of the tape feeder is made as small as possible, a compact tape feeder is realized. Hereby, many tape feeders can be arranged in a narrow space.

Referring next to FIGS. 6 and 7, arrangement of the motor 30 in the top tape feed mechanism 14 will be described. FIG. 6 shows side arrangement of the bevel gears 32 and the motors 30 in the feeder units 40A and 40B, in which reference numerals 30A, 30B, 31A, 31B, 32A, and 32B show respectively the motors 30, the bevel gears 31 and the bevel gears 32 in the feeder units 40A and 40B. Further, FIG. 7 shows a plan view of FIG. 6.

As shown in FIGS. 6 and 7, the respective bevel gears 32A and 32B are arranged coaxially in the two feeder units 40A and 40B, and they hold a shaft axis C2 in common. Further, directions of the respective rotary shafts 30a of the motors 30A and 30B are coincided with each other toward this shaft axis C2, so that the motors 30A and 30B are arranged in radial pattern. In this radial arrangement, directions of the respective rotary shafts 30a of the motors 30A and 30B are distributed around the shaft axis C2 at an angle β.

By adopting this motor arrangement, the similar effect to that in the arrangement of the motor 20 in the tape pitch feed mechanism 12 can be obtained. Namely, as shown in FIG. 7, the whole width B2 including the two motors 30A and 30B can be made smaller than a twice size of diameter D2 of a single motor, so that the widthwise size of the tape feeder can be made as small as possible and a compact tape feeder is realized.

According to the invention, in the tape feed mechanism arrangement of the multi-type tape feeder in which the plural tape feed units are arranged in parallel, the respective first bevel gears are arranged in the positions where they hold the shaft axis in common, and the electric motors are arranged in radial pattern so that the directions of the respective rotary shafts are coincided with each other toward the shaft axis. Therefore, the widthwise sizes of the electric motors can be overlapped, so that the whole width size of the multi type tape feeder can be reduced.

What claimed is:

1. A tape feeder, for supplying electronic parts held on a carrier tape to a pick-up position for a mount head of an electronic part mounting apparatus by feeding the carrier tape in pitch-feed motion, comprising:

plural tape feed mechanisms each including:

a tape feed member that rotates around a horizontal axis thereby to perform a tape feed operation, a first bevel gear for driving said tape feed member, a second bevel gear engaging with said first bevel gear, an electric motor for driving said second bevel gear, wherein said first bevel gears are arranged in positions where they hold their shaft axis in common, said electric motors having a diameter are arranged in radial pattern so that their rotary shaft directions coincide with each other toward the shaft axis of the first bevel gears, wherein the shafts form an angle α such that the motors are not superimposed with respect to each other as viewed parallel to the shaft axis of the first bevel gears and wherein the width required to arrange multiple motors is less than the combined width of the diameter of the multiple motors, and said plural tape feed mechanisms are arranged in parallel positions.

2. The tape feeder according to claim 1, wherein said tape feed mechanism feeds said carrier tape in pitch-feed motion, and said tape feed member is a sprocket which interlocks with feed holes formed in the carrier tape at a fixed pitch.

3. The tape feeder according to claim 2, wherein said first bevel gear is formed integrally with said sprocket.

\* \* \* \* \*

UNITED STATES PATENT AND TRADEMARK OFFICE
CERTIFICATE OF CORRECTION

PATENT NO. : 6,857,546 B2
DATED : February 22, 2005
INVENTOR(S) : Saho

It is certified that error appears in the above-identified patent and that said Letters Patent is hereby corrected as shown below:

Column 4,
Line 30, please delete "402" and insert therefor -- 40B --.
Lines 33, 35 and 44, please delete "202" and insert -- 20B --.
Line 46, please delete "222' and insert -- 22B --.

Signed and Sealed this

Seventeenth Day of May, 2005

JON W. DUDAS
*Director of the United States Patent and Trademark Office*